United States Patent [19]
Klatser et al.

[11] Patent Number: 5,834,973
[45] Date of Patent: Nov. 10, 1998

[54] VOLTAGE ISOLATION CIRCUIT FOR A MEASUREMENT CHANNEL

[75] Inventors: Paul Klatser, Markelo; Egbert Jan Cornelis Kruisdijk, Enschede, both of Netherlands

[73] Assignee: Fluke Corporation, Everett, Wash.

[21] Appl. No.: 848,786

[22] Filed: May 1, 1997

[51] Int. Cl.$^6$ ..................................................... H03F 3/68
[52] U.S. Cl. .............................. 330/126; 330/59; 330/84; 330/308
[58] Field of Search ................................ 330/84, 59, 126, 330/151, 308

[56] References Cited

U.S. PATENT DOCUMENTS

| | | | |
|---|---|---|---|
| 2,760,011 | 8/1956 | Berry | 330/126 |
| 2,961,614 | 11/1960 | Neff | 330/126 X |
| 5,517,154 | 5/1996 | Baker et al. | 330/59 |

*Primary Examiner*—James B. Mullins

[57] ABSTRACT

A voltage isolation circuit having an improved method of combining the HF path and LF path is provided. The LF path comprises an opto-isolator to achieve voltage isolation of the input signal while passing low frequencies. The HF path comprises a transformer to achieve voltage isolation of the input signal while passing high frequencies. The HF path and LF path are combined at a summing node to obtain an isolated input signal. Obtaining a flat frequency response requires that the cross-over frequency between the LF path and HF path be closely matched. A portion of the LF path is injected into the HF path such that LF components are canceled out in the region of the transition frequency. In this way, the pole frequency of the transformer in the HF path may be compensated for to achieve a flat frequency response for the combined LF and HF paths.

10 Claims, 4 Drawing Sheets

VOLTAGE ISOLATION CIRCUIT FOR A MEASUREMENT CHANNEL

BACKGROUND OF THE INVENTION

This invention relates generally to electronic measurement instruments and in particular to a circuit for providing voltage isolation of a measurement channel using parallel low and high frequency signal paths.

Test and measurement equipment such as voltmeters and oscilloscopes measure signals in a wide variety of applications. Many of these applications require measuring multiple signals at the same time using multiple measurement channels. Often, these multiple signals do not share a common ground and may be at substantially different reference levels, thus requiring voltage-isolation between measurement channels coupled to the multiple signals, as well as between each of the measurement channels and the remaining portion of the measurement instrument. For example, a measurement application that requires measuring an output voltage of a power supply while simultaneously measuring the power line input must be done with two measurement channels that are voltage-isolated from each other. However, many measuring instruments have multiple measurement channels that share a common ground at the input terminals, making such commonly desired measurements as the previously power supply example very difficult.

The primary problem with measurement channels that are not voltage-isolated is in getting valid measurements. Interference between the multiple signals may result from the differential currents that flow through the common ground because of the different reference levels of the signals. It is also possible that the device being tested can be damaged through differential currents that can flow between the circuit nodes being tested. At high voltages, the common ground may "float" up to hazardous voltage levels to become a safety hazard to the operator who comes in contact with the common ground connection now unexpectedly at an unsafe voltage potential. It is critical that the instrument ground remain at a safe level rather than attempting to "float" the instrument ground to an unsafe level in order to obtain a measurement.

A solution to the common ground problem when no voltage-isolated measurement channels were available was to provide two measurement channels that can measure a signal differentially such that the voltage difference is not measured with respect to ground. Such differential mode measurements were difficult both to set up and to obtain signal measurements of acceptable accuracy. Furthermore, two measurement channels must be used to get one voltage measurement. Thus, a total of four input channels are required to obtain two simultaneous measurements of signals with different reference levels, making this solution relatively expensive and with only partially successful measurement results.

Voltage-isolated measurement channels that do not share a common ground connection have a number of advantages. First, ensuring an accurate measurement requires that signals between measurement channels not be contaminated by differential currents flowing through the common ground connection between the measurement channels. Furthermore, operator safety is a concern where a common ground connection between input channels that are not isolated may expose the instrument operator to a hazardous voltage source. Voltage-isolation requires coupling each of the input signals through a voltage isolation barrier which serves to pass the input signal while providing isolation between each of the measurement channels of the reference voltage level of each of the input signals.

Achieving voltage isolation between each of the measurement channels within the measurement instrument thereby prevents unexpected connections to hazardous voltage levels via the instrument ground. Voltage-isolated measurement channels with separate measurement channel grounds simplify the task of setting up a measurement because the user can simply couple each measurement channel to each signal, without regard for the reference voltage levels of each of the signals.

It is known in the art to combine optical technology and transformer technology as a low frequency path (LF path) and a high frequency path (HF path) respectively, in order to achieve improved amplitude response flatness over a desired range of frequencies. The optical technology, typically in the form of an opto-isolator, operates at lower frequencies but is bandwidth limited such that its amplitude response rolls off at higher frequencies. Conversely, the transformer operates at higher frequencies but its amplitude response rolls off at lower frequencies. By combining the two technologies as parallel HF and LF paths, a flatter frequency response may be obtained over a broader frequency range. However, in practice, such voltage isolation circuits in measurement instruments have traditionally suffered from the ability to achieve a flat frequency response over a wide range of frequencies, often requiring complex adjustments and amplitude compensation circuits in order to obtain an acceptably flat frequency response.

In FIG. 1, there is shown a simplified block diagram of a voltage isolation circuit 10 for providing voltage isolation of an input signal according to the prior art. The voltage isolation parallel LF paths and HF paths. An input signal is provided to an LF path 14 and an HF path 12 which operate to provide voltage isolation of the input signal. The LF path 14 and HF path 12 are recombined at a summing node 16 to obtain an isolated input signal.

As shown in FIG. 2, the frequency response characteristics for the HF path 12, the LF path 14, and the combined HF and LF paths are shown. The vertical axis is the amplitude response which is a transfer function expressed as H(f) in terms of decibels (dB) while the horizontal scale is frequency which is typically scaled logarithmically. Amplitude response is conmmonly understood to the ratio of output signal amplitude to input signal amplitude. FIG. 2 is prepared as a bode diagram which is drawn using straight line segments, with the intersections of line segments indicating the presence of a pole or zero. The bode diagram is commonly known in the art for analyzing the effects of poles and zeros on amplitude responses.

Frequency responses 18 and 20, corresponding to the LF path 14 and HF path 12 respectively, may be combined to obtain a frequency response 22 for the combined HF and LF paths. The frequency response 20 contains a single pole at frequency Fr. The frequency response 18 contains a single zero at frequency Fr. In order to make the frequency response 22 as flat as possible, the gains of the frequency responses 18 and 20 over their flat regions must be substantially equal and the single pole and zero of the frequency responses 18 and 20 must both be at frequency Fr as shown, with no other poles or zeros in the immediate vicinity. The frequency Fr is commonly called the cross-over frequency. Obtaining an acceptably flat frequency response 22 often require numerous adjustments and the addition of complex frequency compensation circuits.

In U.S. Pat. No. 5,517,154, issued May 14, 1996, to Baker et al., Tektronix, Inc., assignee, a voltage isolation circuit employing a transformer in the HF path and an opto-coupler in the LF path is described. Baker et al. teach combining the HF path and the LF path in the secondary winding of the transformer in the HF path to obtain a flat frequency response. By using the magnetic flux components in the transformer from the primary and secondary windings to co-act, a flat frequency response may be obtained in the region of the crossover frequency. The gain of the HF path and LF paths must be matched and an offset voltage in the LF path must be adjusted.

Therefore, it would be desirable to provide a voltage isolation circuit that allows for obtaining a flat frequency response with fewer adjustments and reduced component count.

SUMMARY OF THE INVENTION

In accordance with the present invention, a voltage isolation circuit having an improved method of combining the HF path and LF path using an interpath compensation signal is provided. The LF path comprises an opto-isolator to achieve voltage isolation of the input signal while passing low frequencies. The HF path comprises a transformer to achieve voltage isolation of the input signal while passing high frequencies. The HF path and LF path are combined at a summing node to obtain an isolated input signal.

Obtaining a flat frequency response requires that the cross-over frequency between the LF path and HF path be closely matched. Achieving such a match is difficult because the transformer has a pole frequency that varies substantially between transformers. The present invention solves for this variation by injecting a portion of the LF path into the HF path, using cross-path injection, such that LF components in the input signal applied to the HF path are canceled out in the region of the transition frequency. In this way, the pole frequency of the transformer in the HF path may vary within a set of limits and may be compensated for by the zero of the injected LF Subtract Signal to achieve a stable and known transition frequency in the HF path that is matched to the LF path. Only the gain of the LF Subtract Signal need be adjusted in order to compensate for the pole present in the transformer. Removing LF components in the HF path has the additional advantage of reducing the risk of core saturation in the transformer. The LF Subtract Signal is one form of the interpath compensation signal according to the present invention.

Alternatively, a portion of the HF path may be injected into the LF path as an HF Subtract Signal such that HF components are canceled out in the region of the transition frequency. In this way, the transition frequency of the LF path is controlled by the HF path to achieve the required match to the HF path. The HF Subtract Signal is an alternative form of the interpath compensation signal according to the present invention.

One object of the present invention is to provide a voltage isolation circuit having a flat frequency response.

Another object of the present invention is to provide a voltage isolation circuit having an HF path and an LF path employing an interpath compensation signal to match transition frequencies.

An additional object of the present invention is to provide a voltage isolation circuit having an HF path and an LF path which are combined in a summing node and employing an interpath compensation signal to match transition frequencies.

Other features, attainments, and advantages will become apparent to those skilled in the art upon a reading of the following description when taken in conjunction with the accompanying drawings.

DETAILED DESCRIPTION OF THE INVENTION

Figure 1:
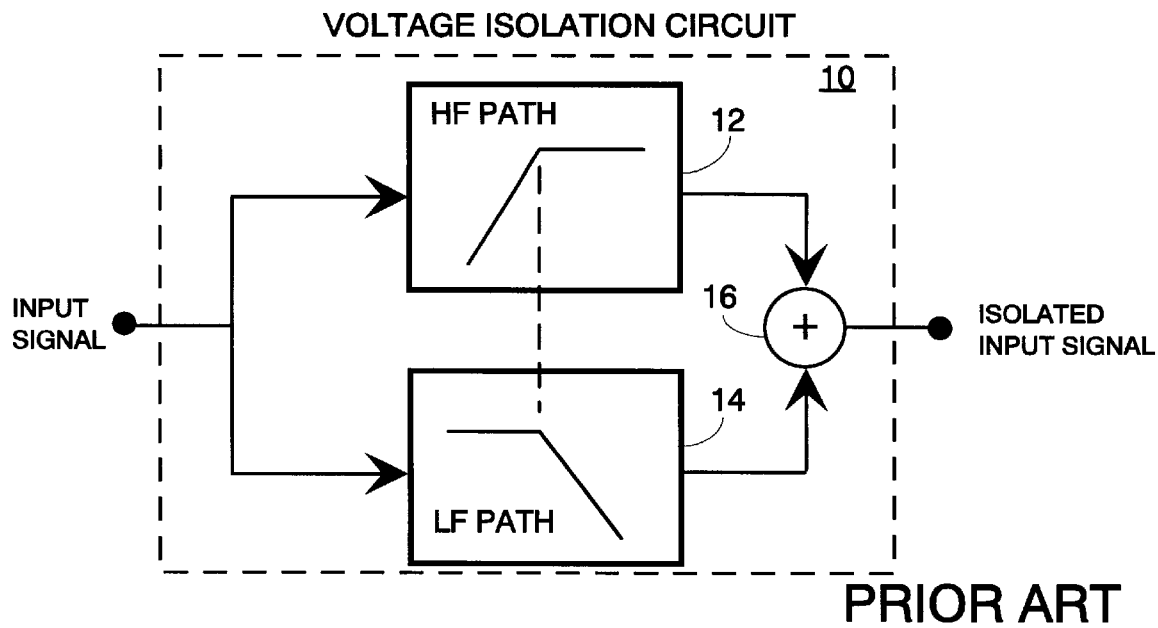
FIG. 1 is a simplified block diagram of a voltage isolation circuit employing separate HF and LF paths according to the prior art.
Figure 2:
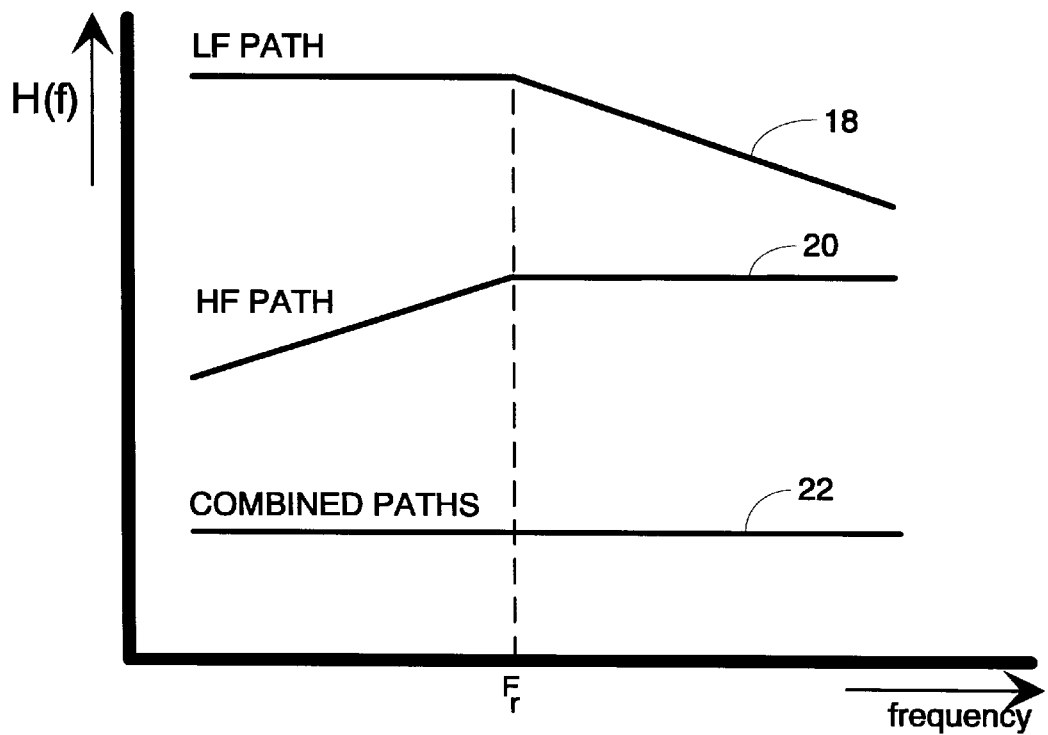
FIG. 2 is a bode diagram drawn in terms of frequency versus amplitude response of the voltage isolation circuit of FIG. 1.
Figure 3:
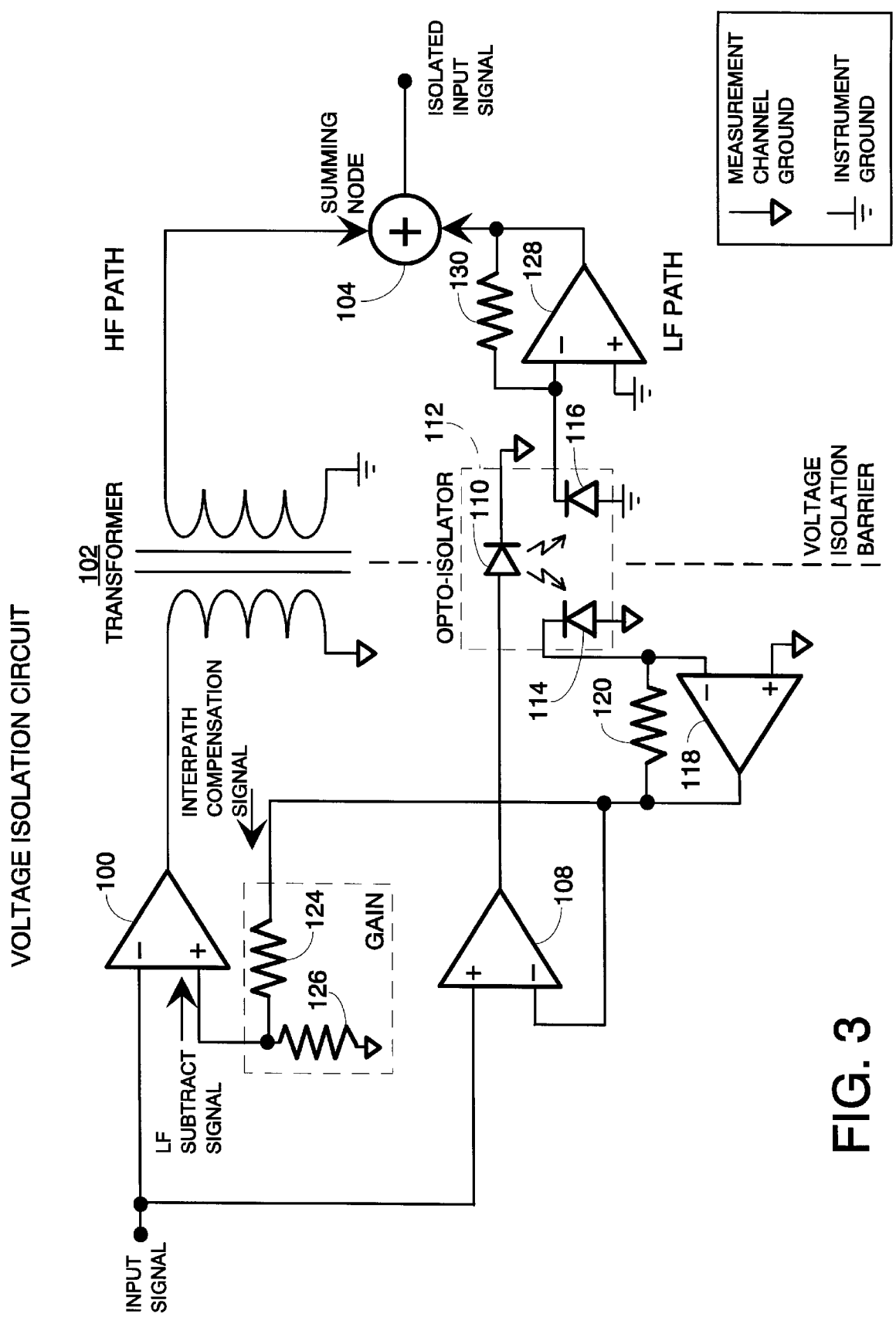
FIG. 3 is a simplified schematic drawing of a voltage isolation circuit according to the preferred embodiment of the present invention.

In FIG. 3, there is shown a simplified schematic diagram of a voltage isolation circuit for use in a measurement instrument according to the present invention. The input signal may have a high common mode voltage relative to the measurement instrument ground, making it necessary to provide voltage isolation between the input voltage and the measurement instrument.

The input signal is coupled to an inverting input of an amplifier 100. An output of the amplifier 100 is connected to one side of an input winding of a transformer 102. The input winding is electromagnetically coupled to an output winding while providing for voltage isolation between the input and output windings. The other side of the input winding is coupled to measurement channel ground while the output winding is coupled to instrument ground. Because the transformer 102 provides voltage isolation, the measurement channel ground and instrument ground are not connected and may be at entirely different potentials.

Numerous other design considerations for the transformer 102, including interwinding capacitance and type of core material, are important in terms of determining the minimum and maximum usable frequencies of the transformer 102 and the maximum signal level that may be allowed while avoiding core saturation. The output winding of the transformer 102 is coupled to a summing node 104. The HF PATH thus comprises the path of the input signal through the amplifier 100, the transformer 102 and the summing node 104. The transformer 102 has an amplitude response that rolls off at lower frequencies, typically according to a single pole at a transition frequency.

The input signal is further coupled to a non-inverting input of an amplifier 108. An output of the amplifier 108 is coupled to a light emitting diode (LED) 110 within an opto-isolator 112. The input signal is converted into light energy which is emitted from the LED 110 and optically coupled to photodiodes 114 and 116. The opto-coupler 112 thus provides for a voltage isolation barrier between the LED 110 and the photodiodes 114 and 116 while passing the input signal at low frequencies. The opto-coupler 112 has a limited bandwidth and its amplitude response rolls off at higher frequencies, typically according to a single zero at a second transition frequency.

The output from photodiode 114 is provided to an inverting input of an amplifier 118. A resistor 120 is coupled between the inverting input and an output, causing the amplifier 118 to operate as a current to voltage converter which produces a LF signal voltage proportional to the output of the photodiode 114. The LF signal voltage is fed back to the inverting input of the amplifier 108 to form an optical feedback loop to control the linearity of the LED 110. The LF signal voltage is further coupled as an interpath compensation signal to resistors 124 and 126 which set the GAIN of the LF signal voltage which is further coupled to a non-inverting input of the amplifier 100 to form the LF SUBTRACT SIGNAL.

The photodiode 116 is coupled to an inverting input of an amplifier 128. A resistor 130 is coupled between the inverting input and an output of the amplifier 128 causing the amplifier 128 to operate as a current to voltage converter. The LF signal from the output of the amplifier 128 is coupled to an input of the summing node 104. The LF SUBTRACT SIGNAL operates as the interpath compensation signal to achieve alignment between the transition frequencies of the respective HF and LF paths.

The summing node 104 may comprise an active amplifier which provides isolation between the HF path and the LF path. The signals from the HF path and the LF path are summed together in a linear fashion to obtain an isolated input signal with the desired amount of bandwidth and without contributing a substantial amount of distortion to the input signal. Alternatively, the summing node 104 may comprise only passive components such as resistors to achieve further gains in linearity but with some loss of isolation between the HF path and LF path.

The LF SUBTRACT SIGNAL present at the amplifier 100 is inverted from the LF components present in the input signal and operates to cancel these components according to the signal bandwidth available from the opto-coupler 112. As long as the available bandwidth of the LF SUBTRACT SIGNAL exceeds the frequency of the pole of the transformer 102, the pole is effectively canceled and the transition frequency of the HF path is effectively determined by the LF path. In this way, a match between the transition frequencies of the HF path and the LF path may be achieved, even if there is a substantial amount of variation in the pole frequency of the transformer 102. Using the resistors 124 and 126 to set the appropriate level of gain in the GAIN element, the pole of the transformer 102 may be effectively canceled by the zero introduced by the LF SUBTRACT SIGNAL from the LF path. The transition frequency of the HF path is now determined by the transition frequency of the LF path to achieve a flat frequency response in the combined HF and LF paths. The LF SUBTRACT SIGNAL operates as the interpath compensation signal to obtain a flat frequency response of the combined HF and LF paths.

Figure 4:
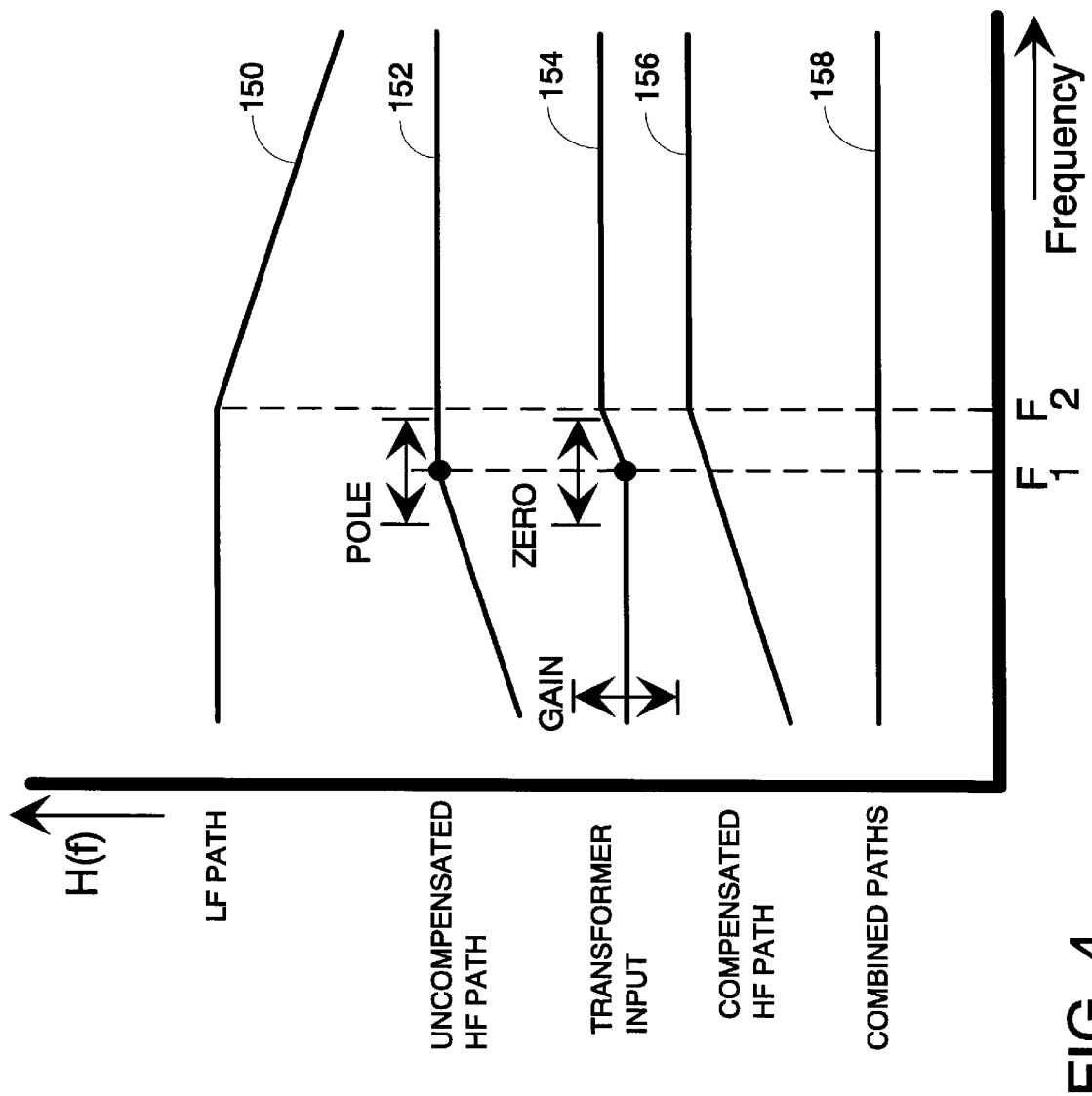
FIG. 4 is a bode diagram modeling the frequency response of the voltage isolation circuit of FIG. 3.

FIG. 4 is a bode diagram of frequency versus transfer function to more fully describe the operation of the voltage isolation circuit of FIG. 3. Trace 150, corresponding to the transfer function of the LF path, has a shape which is primarily determined by the frequency response of the opto-isolator 112. The trace 150 shows a pole at frequency F2 which is the primary roll-off frequency of the LF path.

A trace 152 corresponding to the transfer function of the HF path with no compensation has a shape primarily determined by the frequency response of the transformer 102. Because of manufacturing and materials tolerances, the transformer 102 will have a pole that may occur at any frequency in the range around a transition frequency F1 as shown by the double arrow. In this illustration, the pole occurs directly at the transition frequency F1. This variability in pole frequency across different transformers is compensated for using the LF SUBTRACT SIGNAL in order to achieve the desired level of flatness as explained in more detail below.

A trace 154 represents to the transfer function of the portion of the HF path comprising the amplifier 100 which provides the differential subtraction of the LF SUBTRACT SIGNAL from the input signal which is present at the input winding of the transformer 102. The trace 154 has a zero shown occurring at frequency F1 but which can be adjusted up or down in frequency to coincide with the pole frequency of the trace 152 by adjusting up or down the GAIN element comprising the resistors 124 and 126.

A trace 156 corresponding to the transfer function of the compensated HF path is obtained by combining the traces 152 and 154. The compensated HF path now has a pole frequency at F2 corresponding to the zero frequency of the LF path.

A trace 158, corresponding to the transfer function of the combined compensated HF path and LF path, illustrates the overall frequency response of the voltage isolation circuit between the input signal and the isolated input signal. In order to compensate for the pole of the transformer 102, the transition frequency F2 in the LF path must be greater than or equal to the transition frequency F1. Thus, the range of variation of the transition frequency F1 due to variations of the transformer 102 must be known in order to assure that the compensation by the interpath compensation signal can be achieved.

Figure 5:
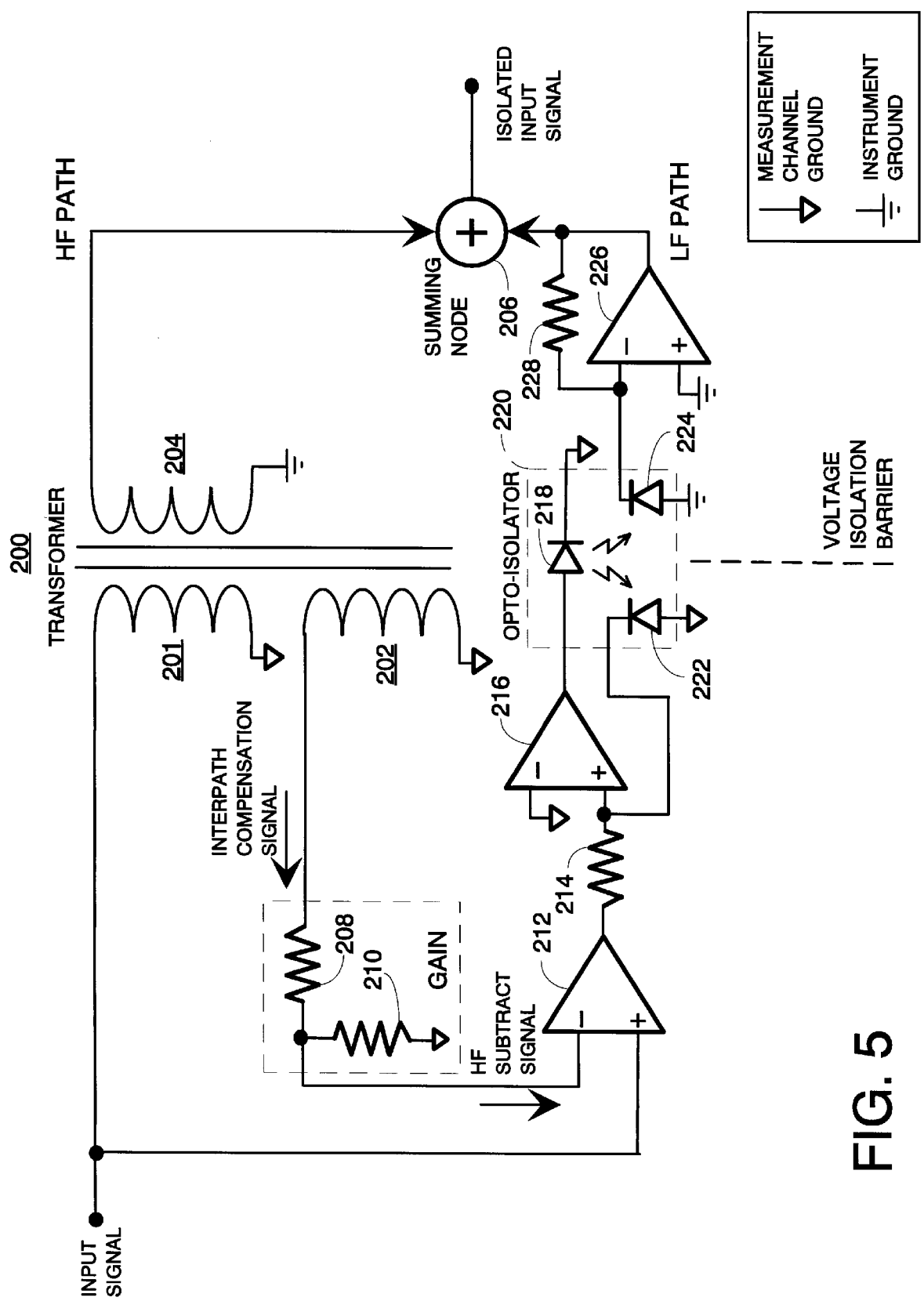
FIG. 5 is a simplified schematic drawing of a voltage isolation circuit according to an alternative embodiment of the present invention.

In FIG. 5, there is shown a simplified schematic diagram of a voltage isolation circuit according to an alternative embodiment of the present invention. Instead of developing an LF SUBTRACT SIGNAL and injecting it from the LF path in to the HF path as discussed above, the alternative embodiment operates by developing an HF SUBTRACT SIGNAL and injecting it into the LF path in order to obtain a compensated LF path in an analogous fashion. In this way, the HF SUBTRACT SIGNAL operates as the interpath compensation signal to achieve alignment between the transition frequencies of the respective HF and LF paths.

The input signal is coupled to an input winding 201 of a transformer 200. The input winding is electromagnetically coupled to a pair of output windings 202 and 204 which receive the input signal in an identical manner but with voltage isolation between each other and the input winding 201. The output winding 204 is coupled to a summing node 206 which receives the HF signal. A copy of the HF signal is developed by the output winding 202 which is coupled to the resistors 208 and 210 which operate to set the gain of the HF SUBTRACT SIGNAL which is provided to an inverting input of an amplifier 212. An end of the input winding 201 and an end of the output winding 202 are coupled to the measurement channel ground. The input signal is further coupled to a non-inverting input of the amplifier 212. An output of the amplifier 212 is coupled via a resistor 214 to a non-inverting input of an amplifier 216. An output of the amplifier 216 is coupled to an LED 218 of an opto-coupler 220.

Photodiodes 222 and 224 receive the light energy generated by the LED 218 to from the input signal and further provide the voltage isolation. The signal from the photodiode 222 is provided to the inverting input of the amplifier 216 to form an optical feedback loop. The photodiode 224 is coupled to an inverting input of an amplifier 226. The photodiodes 222 and 224 are coupled to the measurement channel ground and the instrument ground respectively and are voltage isolated from each other and from the LED 218. A resistor 228 is coupled between the inverting input and an output of the amplifier 226, causing the amplifier 226 to operate as a current to voltage converter to produce a copy of the input signal which is presented to an input of the summing node 206. The summing node 206 combines the HF signal and the LF signal to produce the isolated input signal.

It will be obvious to those having ordinary skill in the art that many changes may be made in the details of the above described preferred embodiments of the invention without departing from the spirit of the invention in its broader aspects. For example, additional forms of interpath compensation signals may be employed to compensate for various pole and zero combinations. Other types of technology used to obtain voltage isolation, such as fiber optic links, may be substituted to form other types of LF and HF paths as needed and still benefit from the interpath compensation signals according to the present invention. Therefore, the scope of the present invention should be determined by the following claims.

What we claim as our invention is:

1. A voltage isolation circuit for a measurement instrument, comprising:
   (a) a high frequency path having an input for receiving an input signal, said high frequency path producing an electrically isolated high frequency output signal according to a first transition frequency;
   (b) a low frequency path having an input for receiving said input signal, said low frequency path producing an electrically isolated low frequency output signal and further producing a low frequency subtract signal according to a second transition frequency which is coupled to said input of said high frequency path to obtain a compensated high frequency path; and
   (c) a summing node for combining said electrically isolated high frequency output signal with said electrically isolated low frequency output signal.

2. A voltage isolation circuit for a measurement instrument according to claim 1, said high frequency path comprising a transformer with an input winding and an output winding, said input winding coupled to receive said input signal, said output winding electromagnetically coupled to said input winding to receive said input signal to produce said high frequency output signal, wherein said output winding is voltage isolated from said input winding.

3. A voltage isolation circuit for a measurement instrument according to claim 1, said low frequency path comprising an opto-coupler, said opto-coupler comprising a light emitting diode coupled to receive said input signal and first and second photodiodes optically coupled to said light emitting diode to produce said low frequency output signal, wherein said first and second photodiodes are voltage isolated from said light emitting diode.

4. A voltage isolation circuit for a measurement instrument, comprising:
   (a) an input terminal for receiving an input signal;
   (b) a high frequency path coupled to said input terminal for producing a high frequency output signal according to a first transition frequency, said high frequency path including a transformer for isolating said high frequency output signal from input terminal;
   (c) a low frequency path coupled to said input terminal for producing a low-frequency output signal according to a second transition frequency, said low frequency path including an opto-coupler for isolating said low frequency output signal from input terminal;
   (d) means for providing an interpath compensation signal from one of said high frequency path and said low frequency path to the other of said high frequency path and said low frequency path to match said first and second transition frequencies; and
   (e) a summing node coupled to the outputs of said high frequency path and said low frequency path to sum said high frequency output signal and said low frequency output signal.

5. A voltage isolation circuit for a measurement instrument according to claim 4, said interpath compensation signal comprising a low frequency subtract signal which is coupled from said low frequency path to said input of said high frequency path to obtain a compensated high frequency path.

6. A voltage isolation circuit for a measurement instrument according to claim 5, said high frequency path comprising a transformer with an input winding and an output winding, said input winding coupled to receive said input signal, said output winding electromagnetically coupled to said input winding to receive said input signal to produce said high frequency output signal.

7. A voltage isolation circuit for a measurement instrument according to claim 5, said low frequency path comprising an opto-coupler, said opto-coupler comprising a light emitting diode coupled to receive said input signal and first and second photodiodes optically coupled to said light emitting diode, wherein one of said first and second photodiodes produces said low frequency subtract signal.

8. A voltage isolation circuit for a measurement instrument according to claim 4, wherein said interpath compensation signal comprises a high frequency subtract signal which is coupled from said high frequency path to said input of said low frequency path to obtain a compensated low frequency path.

9. A voltage isolation circuit for a measurement instrument according to claim 8, said high frequency path comprising a transformer, said transformer comprising an input winding and first and second output winding electromagnetically coupled to said input winding to receive said input signal wherein one of said first and second output windings produces said high frequency subtract signal.

10. A voltage isolation circuit for a measurement instrument according to claim 8, said low frequency path comprising an opto-coupler, said opto-coupler comprising a light emitting diode coupled to receive said input signal and first and second photodiodes optically coupled to said light emitting diode to produce said low frequency output signal, wherein said first and second photodiodes are voltage isolated from said light emitting diode.

* * * * *